US012204782B2

(12) United States Patent
Karsanbhai Patel et al.

(10) Patent No.: US 12,204,782 B2
(45) Date of Patent: Jan. 21, 2025

(54) COMMUNICATION LOGIC TO ENHANCE AREA EFFECTIVENESS FOR MEMORY REPAIR MECHANISM

(71) Applicant: STMicroelectronics International N.V., Geneva (CH)

(72) Inventors: Urmishkumar Karsanbhai Patel, Chikhali (IN); Danish Hasan Syed, New Delhi (IN); Prateek Singh, Delhi (IN)

(73) Assignee: STMicroelectronics International N.V., Geneva (CH)

( * ) Notice: Subject to any disclaimer, the term of this patent is extended or adjusted under 35 U.S.C. 154(b) by 41 days.

(21) Appl. No.: 18/337,751

(22) Filed: Jun. 20, 2023

(65) Prior Publication Data

US 2024/0427514 A1    Dec. 26, 2024

(51) Int. Cl.
*G06F 3/06* (2006.01)

(52) U.S. Cl.
CPC .......... *G06F 3/0644* (2013.01); *G06F 3/0622* (2013.01); *G06F 3/0658* (2013.01); *G06F 3/0679* (2013.01)

(58) Field of Classification Search
CPC .... G06F 3/0644; G06F 3/0622; G06F 3/0658; G06F 3/0679
See application file for complete search history.

(56) References Cited

U.S. PATENT DOCUMENTS

| | | | |
|---|---|---|---|
| 7,031,188 B2 | 4/2006 | Lee et al. | |
| 8,942,051 B2 | 1/2015 | Adham et al. | |
| 9,262,259 B2 | 2/2016 | Ashkenazi | |
| 11,221,764 B2 | 1/2022 | Miller et al. | |
| 2004/0190331 A1* | 9/2004 | Ross | G11C 29/1201 365/154 |
| 2007/0069297 A1* | 3/2007 | Hu | H01L 23/62 257/355 |
| 2011/0029813 A1 | 2/2011 | Gunderson et al. | |
| 2015/0029801 A1* | 1/2015 | Strulovici | G11C 29/808 365/200 |
| 2016/0187422 A1* | 6/2016 | Kumamoto | G01R 31/31724 714/727 |
| 2018/0113743 A1 | 4/2018 | Zante et al. | |
| 2019/0036706 A1 | 1/2019 | Detert | |
| 2019/0073160 A1 | 3/2019 | Okada | |
| 2020/0072903 A1* | 3/2020 | Nishida | G01R 31/318335 |
| 2020/0082901 A1* | 3/2020 | Mittal | G06F 11/1048 |
| 2022/0380786 A1* | 12/2022 | Mande | C12Q 1/689 |

FOREIGN PATENT DOCUMENTS

KR    101564144 B1    10/2015

* cited by examiner

*Primary Examiner* — Hiep T Nguyen
(74) *Attorney, Agent, or Firm* — Slater Matsil, LLP (57) ABSTRACT

According to an embodiment, a method for testing and repairing local memory in a hardware accelerator from a one-time programmable memory (OTP) is provided. The method includes asserting a grant signal, a loading of a first repair data for a sub-set of the local memory associated with a main-controller from a first partition of the OTP memory, communicating a status signal after completion of the loading indicating a completion of the loading, and de-asserting the grant signal in response to receiving the status signal.

20 Claims, 9 Drawing Sheets

COMMUNICATION LOGIC TO ENHANCE AREA EFFECTIVENESS FOR MEMORY REPAIR MECHANISM

TECHNICAL FIELD

The present disclosure generally relates to design for testing (DFT) and, in particular embodiments, to an improved system architecture for testing and repairing memory.

BACKGROUND

Hardware accelerators, such as Graphics Processing Units (GPUs), Field Programmable Gate Arrays (FPGAs), and Application-Specific Integrated Circuits (ASICs) are specialized hardware devices designed to perform specific tasks more efficiently than traditional general-purpose processors. The use of hardware accelerators in machine learning and artificial intelligence has become increasingly important as the size of datasets and complexity of models have increased, which has led to an increase in both memory count and memory spread across the system-on-chip (SoC).

In the context of AI and machine learning, hardware accelerators can speed up the computation-intensive tasks involved in the training and inference of machine learning models. By offloading computation to specialized hardware, machine learning algorithms can be trained and deployed more quickly and efficiently, leading to better performance and faster time to market for AI-based products and services.

Generally, hardware accelerators require significant amounts of memory space to operate effectively and large amounts of data are stored to, for example, train datasets, model parameters, and compute intermediate results. Thus, the memory in hardware accelerators is becoming increasingly complex, with more memory channels and higher memory bandwidth to support the increasing demands of machine learning and AI workloads. Additionally, as the size of the workloads continues to grow, the amount of memory required to support them also increases.

Traditionally, a hierarchical approach has been used to test and repair memory, simplifying the memory repair process by abstracting the details of the underlying memory subsystem and providing a standardized interface for error detection and correction. In the hierarchical approach, the memory subsystem is divided into multiple levels of abstraction, each with its own set of tests and wrappers. The top-level wrapper interfaces with the external environment and generates test patterns for the lower-level wrappers. The lower-level wrappers verify the functionality and performance of the memory at their respective levels of abstraction and provide feedback to the top-level wrapper.

Conventionally, the loading of the instructions through a test access point (TAP) and communicating with a one-time programmable (OTP) memory is done through the hierarchical approach's top main-controller/sub-controller system architecture. Due to synthesis constraints and many processing cores, multiple controllers are used in artificial intelligence and machine learning applications, necessitating a dedicated OTP memory for each system. However, each system does not necessarily use the entire OTP memory space to store repair data, which results in memory wastage.

A memory test processor calculates a repair signature based on the memory fault location to repair memory using the hierarchical approach. The repair signature is stored in the OTP memory during the manufacturing test. In the field, during the power-up sequence, the repair signature is read from the OTP memory and loaded to the memory repair signature registers.

Thus, an improved system architecture to test and repair memory is desirable.

SUMMARY

Technical advantages are generally achieved by embodiments of this disclosure which describe an improved system architecture for testing and repairing memory.

A first aspect relates to a system for testing and repairing of local memory in a hardware accelerator. The system includes a one-time programmable (OTP) memory, an OTP sequencer circuit, a first main-controller, a second main-controller, and an offset addition and selection logic circuit. The one-time programmable (OTP) memory is configured to sequentially store first repair data in a first partition and second repair data in a second partition for, respectively, a first subset of the local memory and a second subset of the local memory. The OTP sequencer circuit is configured to assert a first grant signal. The first main-controller is coupled to the OTP sequencer circuit and the first subset of the local memory. The first main-controller configured to first load the first repair data for the first subset of the local memory from the first partition, and communicate a first status signal to the OTP sequencer circuit after completion of the first loading indicating a completion of the first loading. The OTP sequencer circuit is further configured to de-assert the first grant signal in response to the OTP sequencer circuit receiving the first status signal and assert a second grant signal in response to the de-asserting of the first grant signal. The offset addition and selection logic circuit is configured to add an offset to an address used by a second main-controller to access the second partition. The second main-controller configured to second load the second repair data for the second subset of the local memory associated with the second main-controller from the second partition using the address to access the second partition, and communicate a second status signal to the OTP sequencer circuit after completion of the second loading indicating a completion of the second loading. The OTP sequencer circuit is further configured to de-assert the second grant signal in response to the OTP sequencer circuit receiving the second status signal.

A second aspect relates to a method for testing and repairing of local memory in a hardware accelerator from a one-time programmable memory (OTP). The method includes asserting, by a one-time programmable (OTP) sequencer circuit, a first grant signal; a first loading, by a first main-controller, of a first repair data for a first sub-set of the local memory associated with the first main-controller from a first partition of the OTP memory; communicating, by the first main-controller, a first status signal to the OTP sequencer circuit after completion of the first loading indicating a completion of the first loading; de-asserting, by the OTP sequencer circuit, the first grant signal in response to the OTP sequencer circuit receiving the first status signal; asserting, by the OTP sequencer circuit, a second grant signal in response to the de-asserting of the first grant signal; adding, by an offset addition and selection logic circuit, an offset to an address used by a second main-controller to access a second partition of the OTP memory comprising a second repair data, wherein the first repair data and the second repair data are sequentially loaded in the OTP memory; a second loading, by the second main-controller, of the second repair data for a second sub-set of the local memory associated with the second main-controller from the second partition of the OTP memory using the address to access the second partition; communicating, by the second main-controller, a second status signal to the OTP sequencer circuit after completion of the second loading indicating a completion of the second loading; and de-asserting, by the OTP sequencer circuit, the second grant signal in response to the OTP sequencer circuit receiving the second status signal.

A third aspect relates to a system for testing and repairing of local memory in a hardware accelerator. The system includes a one-time programmable (OTP) memory, a test control register (TCR), a first main-controller, a second main-controller, and an offset addition and selection logic circuit. The OTP memory is configured to sequentially store first repair data in a first partition and second repair data in a second partition for, respectively, a first subset of the local memory and a second subset of the local memory. The TCR is configured to assert a first grant signal. The first main-controller is coupled to the first subset of the local memory, the first main-controller configured to first load the first repair data for the first subset of the local memory from the first partition in response to the first grant signal being asserted. The offset addition and selection logic circuit coupled to the TCR and the first main-controller. The offset addition and selection logic circuit configured to add an offset to an address used by a second main-controller to access the second partition. The TCR is further configured to de-assert the first grant signal and assert a second grant signal in response to the de-asserting of the first grant signal. The second main-controller configured to second load the second repair data for the second subset of the local memory associated with the second main-controller from the second partition using the address to access the second partition in response to the second grant signal being asserted, wherein the TCR is further configured to de-assert the second grant signal.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a hardware accelerator used in artificial intelligence or machine learning applications, it should also be appreciated that these inventive aspects may also apply to other applications that benefit from efficient, compact, and optimized design for test schemes.

Figure 1:
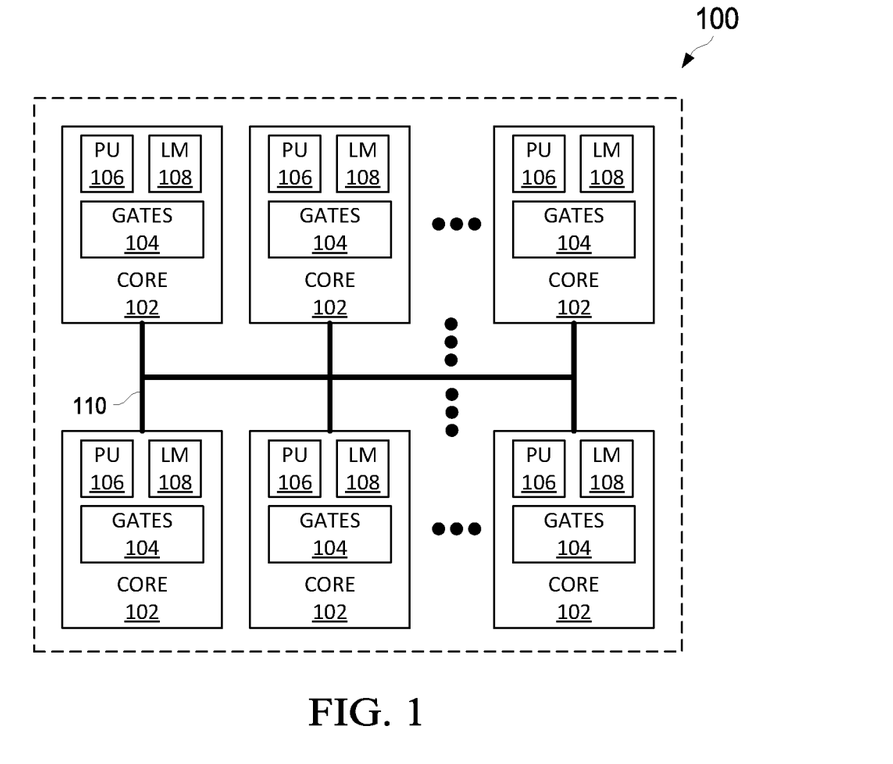
FIG. 1 is a block diagram of an embodiment hardware accelerator.

FIG. 1 illustrates a block diagram of an embodiment hardware accelerator 100. As shown, hardware accelerator 100 includes multiple interconnected cores 102 (i.e., logic blocks), which provides a compact, efficient, flexible, and scalable solution, enabling the integration of diverse functionality into a single chip. In embodiments, each core 102 includes a vast number of gates 104, a processing unit (PU) 106, and local memory (LM) 108, which may (or may not) be arranged as shown. further, hardware accelerator 100 may include additional components not shown. It is noted that the number of cores 102, gates 104, processing unit 106, and local memory 108 are non-limiting.

In embodiments, hardware accelerator 100 is integrated into an artificial intelligence or machine learning system to process large computations in a distributed manner. The combination of parallel architecture, numerous processing units, distributed on-chip memory, and optimized interconnectivity allows the hardware accelerator 100 to achieve high throughput, efficiently process massive amounts of data, and perform quick, complex computations.

Each core 102 may include many gates 104 allowing for intricate designs and integrating numerous functional units and features. In embodiments, hardware accelerator 100 may include cores 102. Cores 102 may represent different functional units or subsystems, such as central processing units (CPUs), graphical processing units (GPUs), peripherals, or custom IP blocks.

Moreover, hardware accelerator 100 can include a massive number of interconnected processing units 106 that operate in parallel to, for example, simultaneously perform computations on one or more problem sets. Processing units 106 typically include CPU cores, GPUs, custom accelerators, or a combination thereof, that can be highly specialized and optimized to perform specific tasks and execute high-throughput operations.

Hardware accelerator 100 includes many distributed on-chip, local memory 108 to facilitate low latency operations on localized data. Generally, the local memory 108 is closely located to the processing unit 106 to minimize latency and enable quick data sharing among the processing unit 106. Local memory 108 can be of different types, such as RAM (Random Access Memory), ROM (Read-Only Memory), or other specialized memory technologies.

Local memory 108 provides storage and data access for the specific functions performed by the respective core 102. Integrating the local memory 108 within each core 102 advantageously allows for faster and more efficient data access as the local memory 108 is closer to the processing unit 106. Additionally, the integration enables the customization and optimization of memory resources based on the specific requirements of each core 102. Different cores 102 may have varying memory capacities, types, or architectures tailored to their needs. Furthermore, having a core 102 with its own dedicated local memory 108 facilitates modularity and scalability in the system design. Each core 102 can operate independently, accessing and managing its associated local memory 108 without interfering with others. This modularity allows for easier development, testing, and maintenance of individual components within the hardware accelerator 100.

The processing units 106 and local memory 108 (and optionally, other components of the core 102) are typically interconnected using a highly optimized network called network-on-chip 110 (NoC). The network-on-chip 110 provides efficient communication channels and high-bandwidth data transfer among the processing units 106, local memory 108, gates 104, and other components of the hardware accelerator 100.

As noted, traditionally, a hierarchical approach has been used to test and repair memory by abstracting away the details of the underlying memory sub-system and providing, for example, a standardized interface for error detection and correction. To achieve reasonable test times, the full set of cores 102 of the hardware accelerator 100 are divided into smaller sub-sets and multiple levels of hierarchy.

Figure 2:
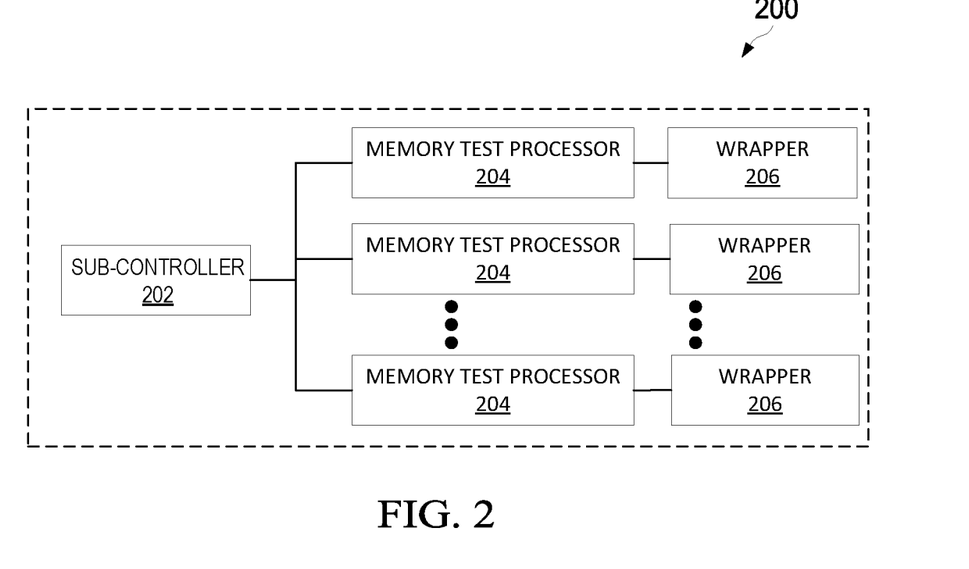
FIGS. 2, 3, and 4, respectively, are a simplified block diagram of a conventional design for testing (DFT) sub-system, system, and multi-system, based on the hierarchical approach.
Figure 3:
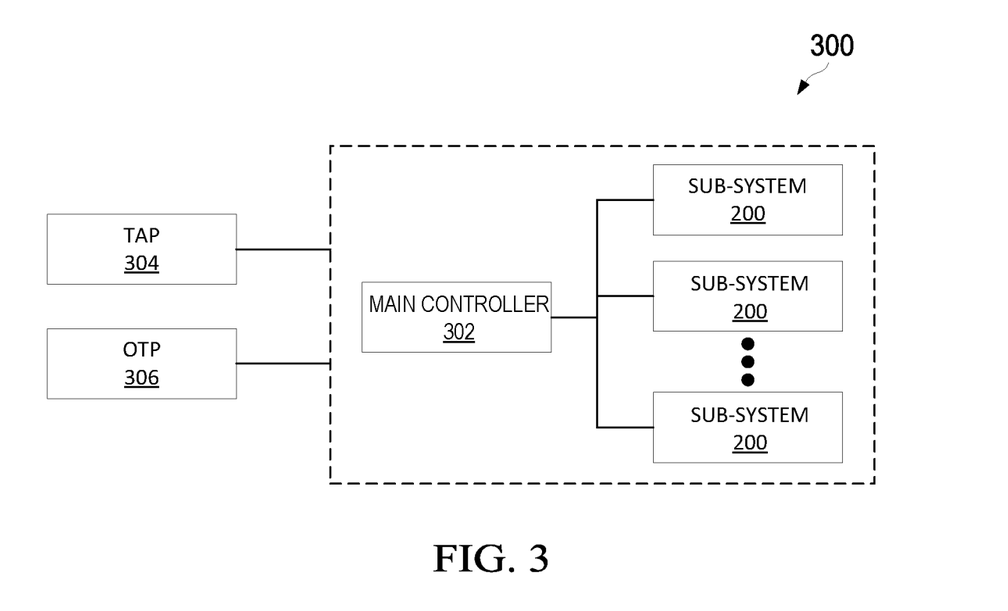
Figure 4:
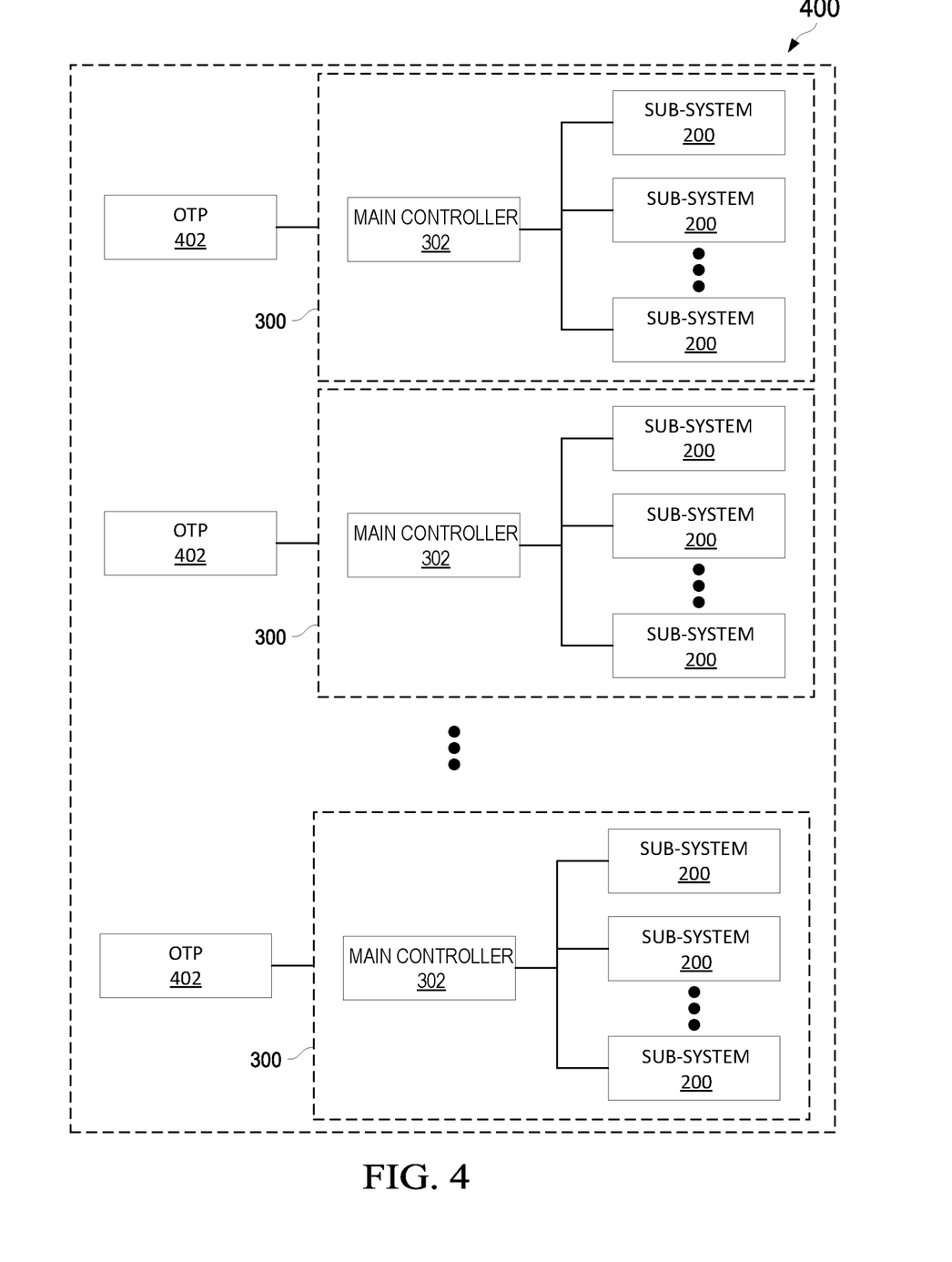

FIGS. 2, 3, and 4, respectively, illustrate a simplified block diagram of a conventional design for testing (DFT) sub-system 200, system 300, and multi-system 400, based on the hierarchical approach. Thus, the sub-system 200 is used to test lower-level blocks of hierarchy, system 300 is used to test multiple sub-systems 200, and multi-system 400 is used to test multiple systems 300.

In embodiments, sub-system 200 may include multiple cores 102. As shown in FIG. 2, a sub-system 200 includes a sub-controller 202, multiple memory test processors 204, and multiple local memory 108, which may (or may not) be arranged as shown. Sub-system 200 may include additional components not shown. The number of components associated with the sub-system 200 is non-limiting.

Each local memory 108 is wrapped within an individual wrapper 206. Each wrapper 206 is associated and coupled to a memory test processor 204. In embodiments, each wrapper 206 includes multiple local memory 108. In some embodiments, multiple wrappers 206 are associated and coupled to a memory test processor 204. In embodiments, the memory test processor 204 is the processing unit 106 of the core 102 associated with the local memory 108. Each memory test processor 204 is configured to test the local memory 108 associated with the wrapper 206. A sub-controller 202 is added to the core 102 and coupled to each memory test processor 204 within the sub-system 200.

In embodiments, system 300 may include multiple sub-systems 200 coupled to a main-controller 302, added to the hardware accelerator 100. System 300 may (or may not) be arranged as shown and may include additional components not shown. In embodiments, the main-controller 302 is coupled to the test access point (TAP) 304 and the one-time programmable (OTP) memory 306. Main-controller 302 is configured to allow the sub-systems 200 to communicate with a common TAP 304. The number of components associated with the system 300 is non-limiting.

TAP 304, or boundary scan, tests and diagnoses digital circuits, including memory subsystems. It generally involves adding dedicated test logic to a circuit that can be used to access and control individual device pins, enabling the testing of internal signals and the detection of faults in the circuit. In memory tests and repair, TAP 304 can access individual memory cells and perform various diagnostic tests, such as read/write, bit-wise comparison, and pattern testing. It can also detect and isolate faults in the memory subsystem.

OTP memory 306, is a type of non-volatile memory that can be programmed only once during manufacturing and retains its value indefinitely. In the context of memory testing and repair, OTP memory 306 can store configuration and repair data used during the memory testing and repair process.

For example, a memory test and repair system may use OTP memory 306 to store a repair map that identifies faulty memory cells and their replacement values. During testing, the system can read the repair map from the OTP memory 306 and use it to replace the faulty memory cells with the correct values stored in the OTP memory 306. OTP memory 306 can also store configuration data, such as test patterns, timing parameters, and other settings used during testing and repair. Thus, TAP 304 enables the testing and diagnosis of the memory subsystem, while OTP memory 306 provides a reliable and non-volatile storage solution for the configuration and repair of data.

For example, in system 300 where the number of sub-systems 200 equals one, the sub-system 200 is coupled to an OTP memory 306 of 256 words through a main-controller 302. In this example, the repair data for the first local memory 108 of the sub-system 200 is stored in the first word of the OTP memory 306, the repair data for the second local memory 108 of the sub-system 200 is stored in the second word of the OTP memory 306, and so forth. In this example, the number of local memory 108 of the sub-system 200 is less than 256 (e.g., thirty-two). As such OTP memory 306 includes a significant amount of memory space that is wasted due to inefficient communication between OTP memory 306 and main controller 302.

Typically, in a system-on-chip not used in artificial learning or machine learning applications, during manufacturing (i.e., production), instructions are loaded from the TAP 304 into the memory test processor 204 to test and repair the local memory 108. During the repair process, repair signatures are calculated and stored in the OTP memory 306. The loading of instructions from the TAP 304 and communication with the OTP memory 306 are done using the sub-system 200 and system 300 DFT architectures. With the increased number of cores 102 in a hardware accelerator 100 used in artificial intelligence and machine learning applications, the design for test architecture has expanded to include a higher-level block above the system 300, known as the multi-system 400.

In embodiments, multi-system 400 may include multiple systems 300, where each system 300 is coupled to a respective, dedicated OTP memory 402. Multi-system 400 may (or may not) be arranged as shown and may include additional components not shown.

Disadvantageously, each system 300 coupled to the respective OTP memory 402 does not utilize the entire memory space of the respective OTP memory 402 for data storage repair. Thus, the usage of a dedicated OTP memory 402 for each system 300 results in wasted and unused space in each OTP memory 402, which, when multiplied by the number of systems 300 in the multi-system 400, results in a large amount of wasted memory space that can be otherwise used for other purposes.

For example, in a multi-system 400 where the number of systems 300 equals two, each system 300 is coupled to a respective OTP memory 402 of 256 words through a respective main-controller 302. In this example, the repair data for the set of local memory 108 of the first system 300 is stored in the first OTP memory 402 and the repair data for the set of local memory 108 of the second system 300 is stored in the second OTP memory 402.

Further, the repair data for the first local memory 108 in the set of local memory 108 of the first system 300 is stored in the first word of the first OTP memory 402, the repair data for the second local memory 108 in the set of local memory 108 of the first system 300 is stored in the second word of the OTP memory 402, and so forth.

Moreover, the repair data for the first local memory 108 in the set of local memory 108 of the second system 300 is stored in the first word of the second OTP memory 402, the repair data for the second local memory 108 in the set of local memory 108 of the second system 300 is stored in the second word of the OTP memory 402, and so forth.

In this example, the number of local memory 108 is less than 256. For example, the quantity of local memory 108 in the set of local memory 108 of the first system 300 is thirty-two and the quantity of local memory 108 in the set of local memory 108 of the second system 300 is twenty. Thus, in the multi-system 400, each OTP memory 402 includes a significant amount of memory space that is wasted due to inefficient communication between the OTP memory 402 and the main controller 302. Further, it is observable that as the size of the local memory 108 is increased in, for example, artificial intelligence and machine learning systems, the use of a dedicated OTP memory 402 for each system 300 results in significant waste in memory space, resulting in a poor memory utilization system.

To address this issue, some design for test architectures include different controllers (e.g., main-controller 302) for repairable and non-repairable memory. Disadvantageously, this solution is limited to only two controllers. A core 102 may contain repairable and non-repairable memory, resulting in complicated timing closure and increased spatial memory streaming (SMS) logic per system block.

Embodiments of this disclosure provide an improved design for test architecture for testing and repairing memory (e.g., local memory 108) that addresses the deficiencies in the existing solutions. In embodiments, a single OTP memory is coupled to the many systems in the multi-system to improve the efficient usage of the OTP memory space in a hardware accelerator. A communication logic circuit is coupled between the single OTP memory and the many systems, which allows each main-controller 302 to communicate with the single OTP memory. Aspects of this disclosure provide a design for test methodology for a system-on-chip used in artificial intelligence or machine learning technology, such as automotive applications. Embodiments of this disclosure similarly apply to production (i.e., manufacturing) and functional (i.e., boot mode) testing. These and further details are discussed in greater detail below.

Figure 5:
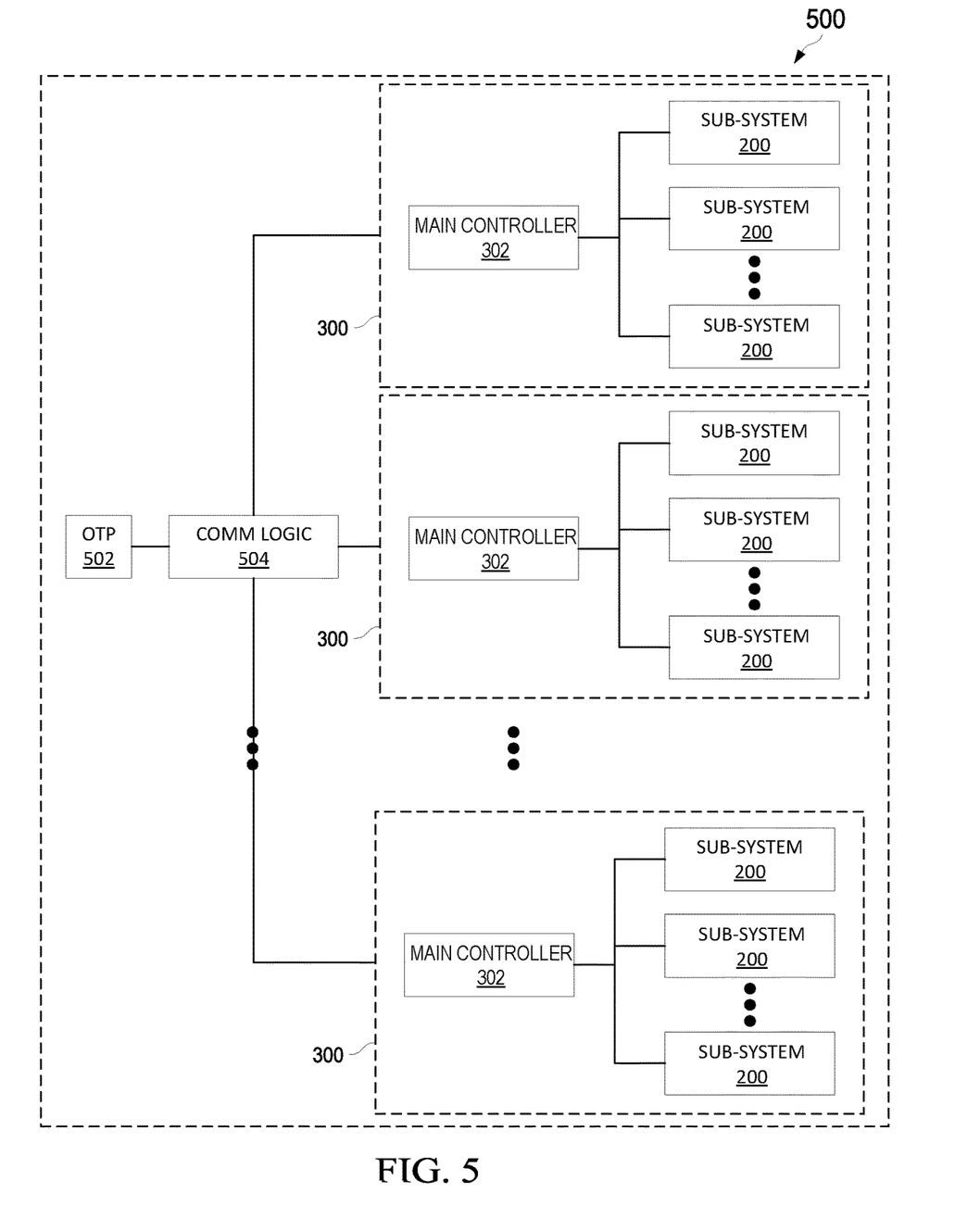
FIG. 5 is a simplified block diagram of an embodiment multi-system.

FIG. 5 illustrates a simplified block diagram of an embodiment multi-system 500, which may (or may not) be arranged as shown. In contrast to the multi-system 400 in FIG. 4, the multi-system 500 in FIG. 5 includes a single OTP memory 502 coupled to each main-controller 302 of each system 300 through a communication logic circuit 504. Each main-controller 302 is coupled to multiple sub-systems 200. Multi-system 500 may include additional components not shown, and the number of components shown in FIG. 5 is non-limiting.

In embodiments, the communication logic circuit 504 is configured to allow each main-controller 302 to communicate with the OTP memory 502. Advantageously, using a single OTP memory 502 for multiple systems 300 allows more efficient usage of memory space compared to the conventional design for test architecture, which included a dedicated OTP memory 402 for each system 300.

Figure 6:
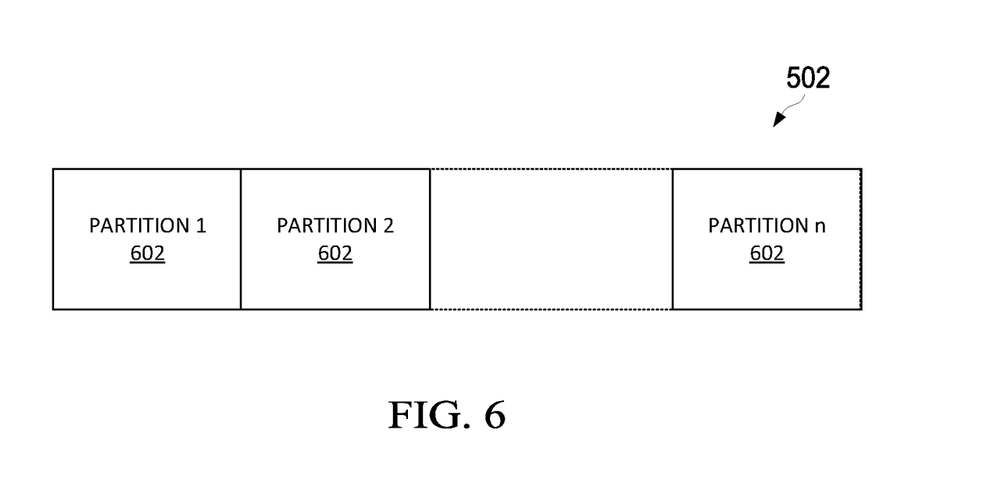
FIG. 6 is a partitioning of an embodiment OTP memory.

FIG. 6 illustrates a partitioning of an embodiment OTP memory 502. As shown, OTP memory 502 is partitioned into n different partitions, where n is an integer greater than one—although OTP memory 502 is shown to include more than two partitions 602, the number of partitions 602 may be fewer or greater and non-limiting. In embodiments, each partition 602 includes an associated repair data (i.e., memory repair signature) for a respective system 300. In embodiments, each partition 602 of the OTP memory 502 is dedicated to a different system 300 in the multi-system 500.

Embodiments of this disclosure, thus, provide an OTP partitioning scheme and a method to address each partition 602 for each system 300 using an offset addition scheme when addressing the OTP memory 502. In embodiments, the repair data for the various systems 300 are sequentially stored within the OTP memory 502. Thus, the memory space wastage in the multi-system 500 is minimized by utilizing a single OTP memory 502 with sequential repair data loaded therein.

It should be understood that the OTP memory 502 and the size of the partitions 602 are decided based on, for example, the repair budget and user data per system 300. Thus, in some embodiments, the memory space of partition 602 is identical; in others, the partition memory space may be different.

For example, in an OTP memory 502, having four kilobytes of memory space and two partitions dedicated to two systems 300, the first partition 602 may have a one-kilobyte memory space, and the second partition 602 may have a three-kilobyte memory space. As another example, in an OTP memory 502, having four kilobytes of memory space and two partitions dedicated to two systems 300, each of the first partition 602 and the second partition 602 may have two kilobytes of memory space.

An associated offset is added to the address bus in embodiments when a main-controller 302 is configured to access the OTP memory 502. In embodiments, a null offset (i.e., zero offset) is added to the address bus when the main-controller 302 associated with the first partition 602 accesses the OTP memory 502. Further, the offset addition scheme is easily scalable to more than two controllers. In embodiments, the addition of the offset to the address bus occurs both in functional (i.e., boot) and test mode.

Figure 7:
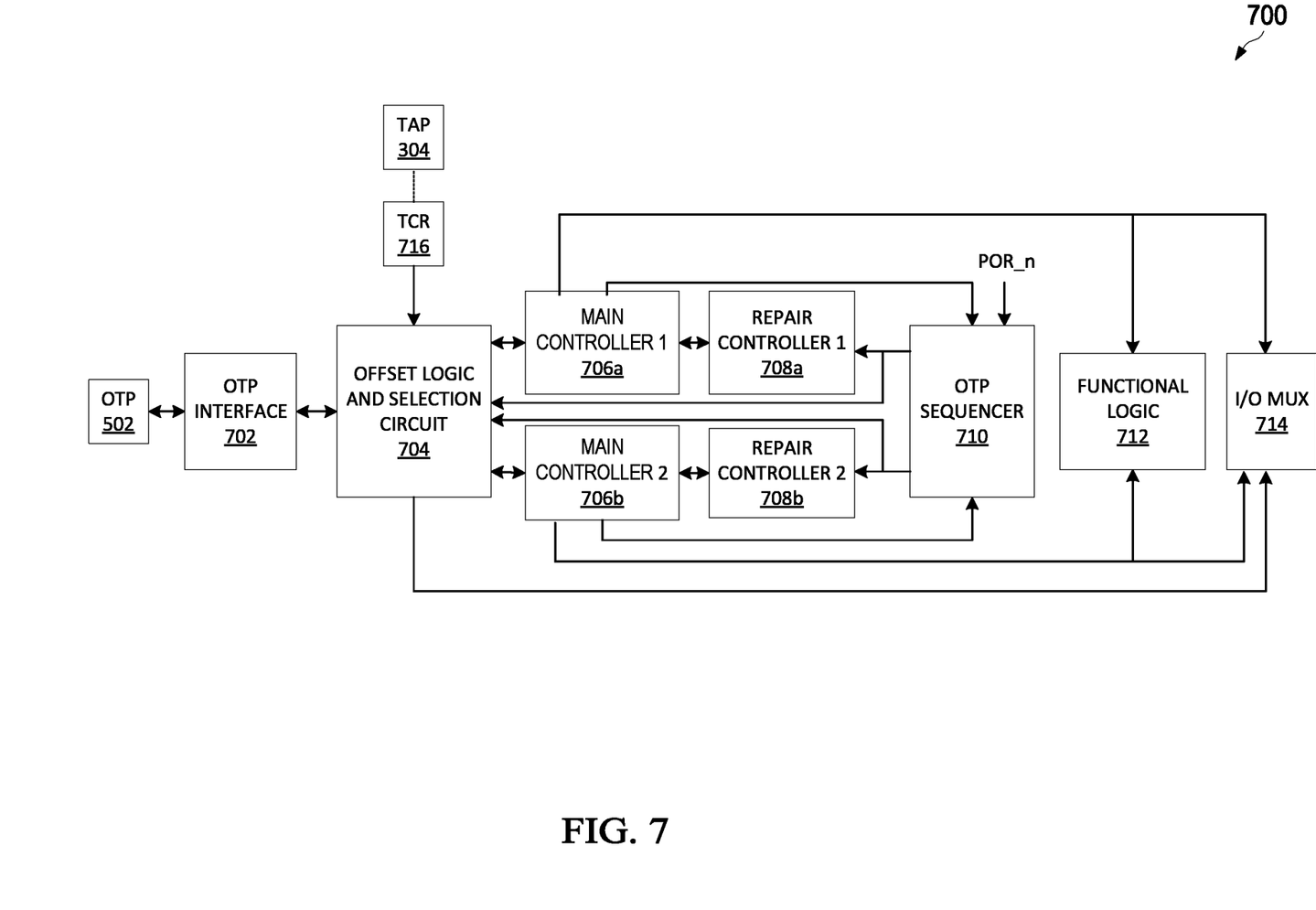
FIG. 7 is a block diagram of an embodiment design for system.

FIG. 7 illustrates a block diagram of an embodiment design for system 700. The system 700 includes the OTP memory 502, an OTP interface circuit 702, an offset logic and selection circuit 704, a test control register (TCR) 716, a first main-controller 706a, a second main-controller 706b, a first repair controller 708a, a second repair controller 708b, an OTP sequencer circuit 710, functional logic 712, and an input/output (I/O) multiplexer 714, which may (or may not) be arranged as shown. System 700 can be used for functional and test mode operations. In embodiments, the TCR 716 is coupled to the TAP 304 such that the TAP 304 can control the operations of the TCR 716 during the test mode.

An optional OTP interface circuit 702, which is a logic circuit coupled to the OTP memory 502 and the offset logic and selection circuit 704, provides error correction code and other safety features in system 700. The OTP interface circuit 702 includes a status terminal, which is coupled to the I/O multiplexer 714, and configured to communicate status signals. In embodiments, the OTP interface circuit 702 is configured to generate an offset to the address signal based on which main-controller 706a-b communicates with the OTP memory 502.

The offset logic and selection circuit 704 is coupled to each main-controller 706a-b, the OTP interface circuit 702, the OTP sequencer circuit 710, and the TCR 716. The offset logic and selection circuit 704 provides for the offset addition.

Although FIG. 7 includes a pair of main-controllers 706a-b, each coupled to a repair controller 708a-b. In embodiments, the system 700 may include more than two main-controllers, each being coupled to a respective repair controller. Thus, the number of main-controllers and repair controllers is not limiting.

Each main-controller 706a-b is coupled to a repair controller 708a-b and the offset logic and selection circuit 704. Further, each main-controller 706a-b may include one or more status terminals to exchange a respective status signal with the OTP sequencer circuit 710, functional logic 712 of the hardware accelerator 100, and the I/O multiplexer 714. In embodiments, the main-controllers 706a-b operate similarly to the main-controllers described hereinabove. For example, each main-controller 706a-b may be part of a respective system 300 as shown in FIG. 5. In embodiments, each main-controller 706a-b is associated with a respective sub-set of the local memory 108 in the hardware accelerator 100.

The OTP sequencer circuit 710 is a logic circuit coupled to the main-controllers 706a-b, repair controllers 708a-b, and the offset logic and selection circuit 704. In embodiments, the OTP sequencer circuit 710 includes a reset terminal configured to receive a functional mode reset (POR_n) signal 802. In embodiments, the logic level of the functional mode reset signal 802 indicates whether the hardware accelerator 100 is operating in functional mode. For example, in response to the functional mode reset signal 802 having a logic level equal '0', the hardware accelerator is not yet booted up, and in response to the functional mode reset signal 802 having a logic level equal '1', the hardware accelerator is running and in functional mode.

The OTP sequencer circuit 710 is configured to generate grant signals during the functional mode operation of the hardware accelerator 100. The OTP sequencer circuit 710 generates a grant signal for each main-controller 706a-b to communicate with the OTP memory 502, during the functional mode. For example, in the embodiment of FIG. 7, which includes a pair of main-controllers 706a-b, the OTP sequencer circuit 710 is configured to generate a first grant signal 804 for the first main-controller 706a and a second grant signal 808 for the second main-controller 706b, during the functional mode. In embodiments, when the first grant signal 804 is asserted, the second grant signal 808 is de-asserted. In embodiments, when the second grant signal 808 is asserted, the first grant signal 804 is de-asserted.

In embodiments, the OTP sequencer circuit 710 includes a dedicated terminal to communicate grant signals for each repair controller 708a-b (as shown). In embodiments, a signal terminal of the OTP sequencer circuit 710 may be used to communicate grant signals to the repair controllers 708a-b (not shown). In other embodiments, other components, such as a multiplexer, may be combined to communicate the grant signals from the OTP sequencer circuit 710.

In embodiments, the first grant signal 804 is communicated from the OTP sequencer circuit 710 to the first repair controller 708a and the offset logic and selection circuit 704. In embodiments, the second grant signal 808 is communicated from the OTP sequencer circuit 710 to the second repair controller 708b and the offset logic and selection circuit 704.

The I/O multiplexer 714 is configured to provide a common selection interface between test status and other functional signals communicated from the main-controllers 706a-b and OTP interface circuit 702.

During functional mode (i.e., when the functional mode reset signal 802 is asserted), the logic level of the grant signals from the OTP sequencer circuit 710 indicates to the repair controllers 708a-b, which main-controller 706a-b is granted access to the OTP memory 502. A repair controller 708a-b instructs the main-controller 706a-b to (e.g., sequentially) load OTP repair data from the OTP memory 502 using the main-controller bus address 812 in response to being granted access to the OTP memory 502. The offset logic and selection circuit 704, which is coupled between the OTP memory 502 and the main-controller 706a-b, provides the appropriate offset to the main-controller bus address 812 to obtain the OTP bus address 814. The OTP bus address 814, thus, includes an offset indicating the partition 602, which the main-controller 706a-b is to access from the OTP memory 502.

The TCR 716 is coupled to the offset logic and selection circuit 704. The TCR 716 is configured to generate grant signals and an access signal 1002 during the test mode operation. In embodiments, TCR 716 generates the access signal 1002 to indicate the operating in test mode. For example, in response to the access signal 1002 having a logic level equal '0', the system is in test mode. In response to the access signal 1002 having a logic level equal to '1', the system is in test mode.

The TCR 716 generates a corresponding grant signal for each main-controller 706a-b to communicate with the OTP memory 502, during test mode. For example, in the embodiment of FIG. 7, which includes a pair of main-controllers 706a-b, the TCR 716 is configured to generate a first grant signal 1004 for the first main-controller 706a and a second grant signal 1006 for the second main-controller 706b, during test mode. In embodiments, when the first grant signal 1004 is asserted, the second grant signal 1006 is de-asserted. In embodiments, when the second grant signal 1006 is asserted, the first grant signal 1004 is de-asserted.

During test mode (i.e., when the access signal 1002 is asserted), the logic level of the grant signals from the TCR 716 indicates which main-controller 706a-b is granted access to the OTP memory 502. A system coupled instructs the main-controller 706a-b to (e.g., sequentially) load OTP repair data from the OTP memory 502 using the main-controller bus address 1008 in response to being granted access to the OTP memory 502. The offset logic and selection circuit 704, which is coupled between the OTP memory 502 and the main-controller 706a-b, provides the appropriate offset to the main-controller bus address 1008 to obtain the OTP bus address 1010. The OTP bus address 1010, thus, includes an offset indicating the partition 602, which the main-controller 706a-b is to access from the OTP memory 502.

Figure 8:
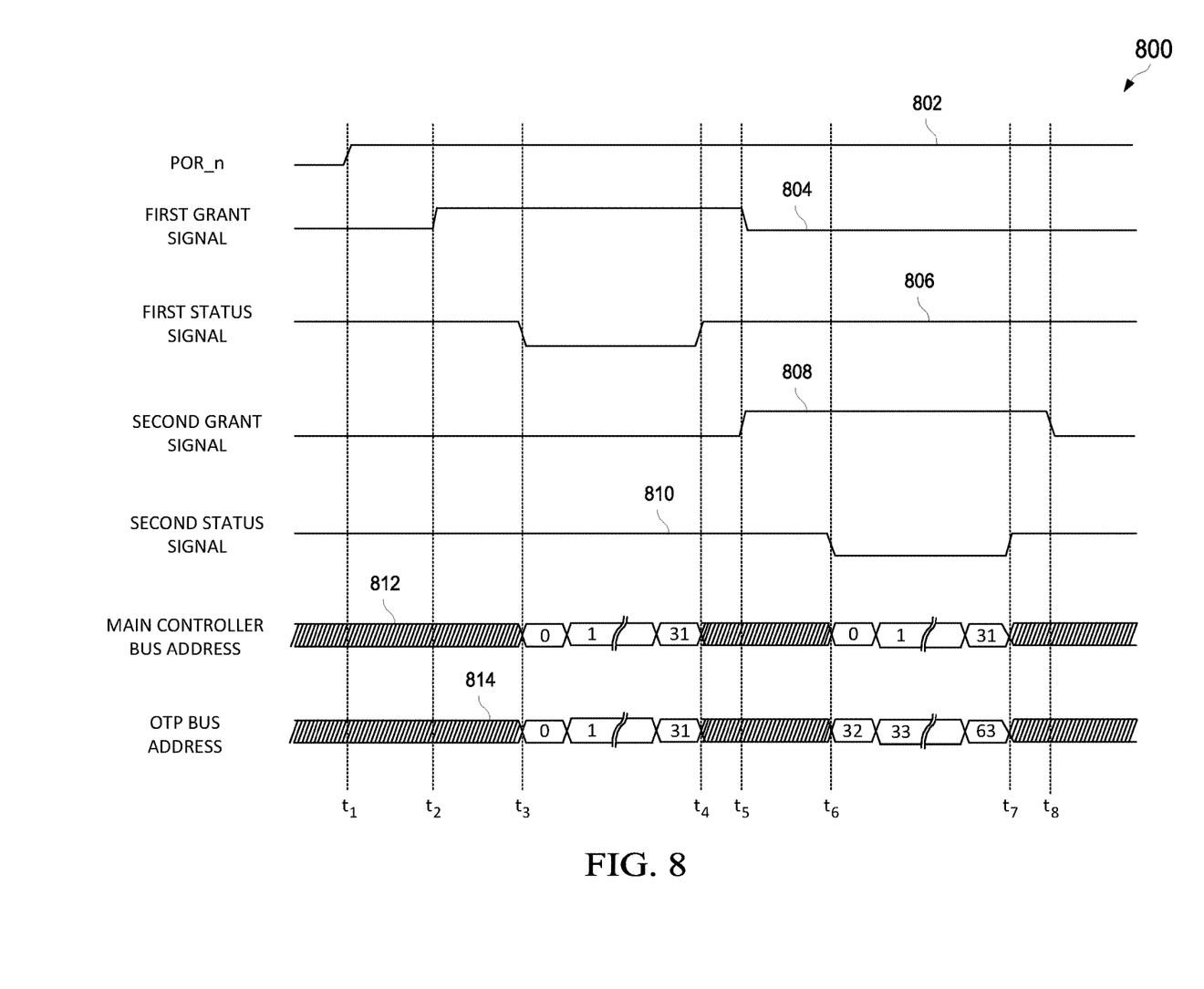
FIGS. 8 and 9, respectively, are an embodiment timing diagram and a corresponding method where the system in FIG. 7 is operating in functional mode.
Figure 9:
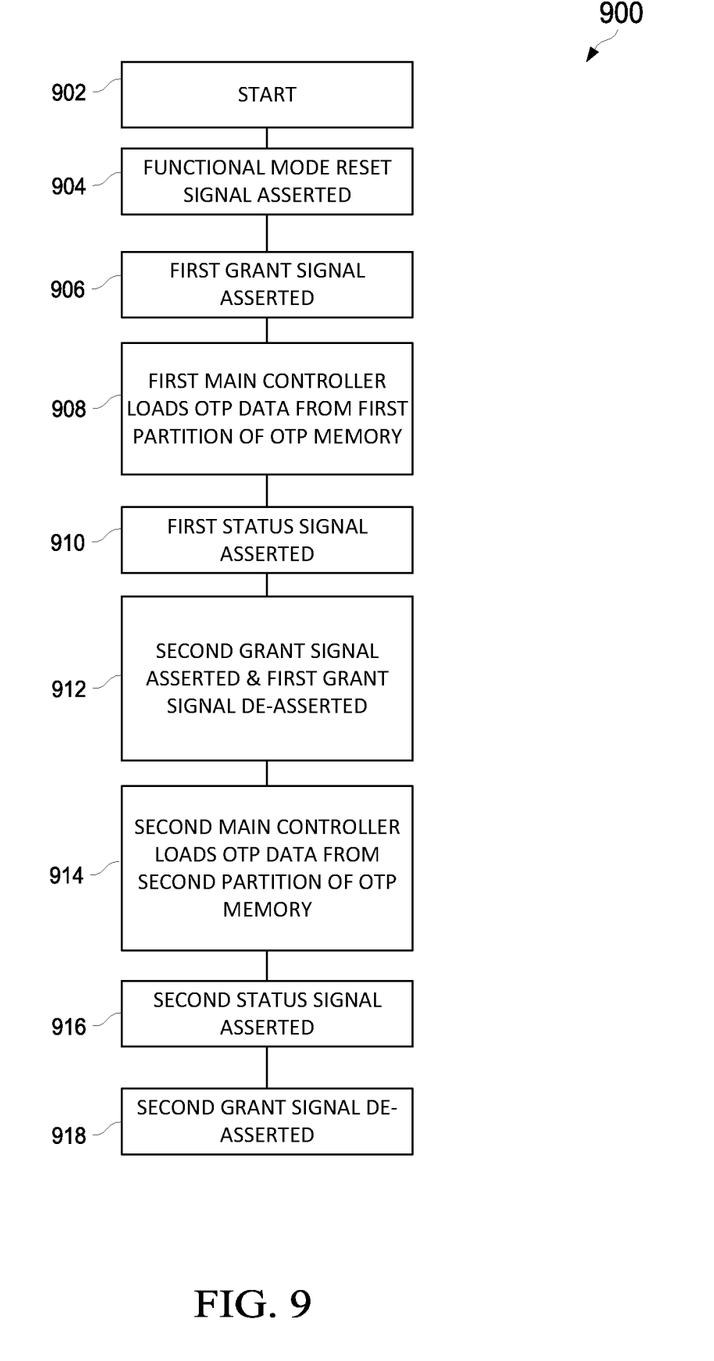

FIGS. 8 and 9, respectively, illustrate an embodiment timing diagram 800 and a corresponding method 900 where system 700 operates in functional mode. The method starts at step 902, before time $t_1$, the functional mode reset (POR_n) signal 802 is de-asserted (e.g., logic level low). As the functional mode reset signal 802 is de-asserted, the system has not yet booted up. At step 904, at time $t_1$, the functional mode reset signal 802 is asserted (e.g., logic level high), and hardware accelerator 100 enters boot mode (i.e., functional mode).

At step 906, at time $t_2$, OTP sequencer circuit 710 asserts (e.g., logic level high) a first grant signal 804 for the first main-controller 706a and the first repair controller 708a. In response to receiving the first grant signal 804 from the OTP sequencer circuit 710, the first repair controller 708a instructs the first main-controller 706a to load OTP repair data. As the associated partition 602 for the first main-controller 706a begins at address 'o', the main-controller bus address 812 is identical to the OTP bus address 814, with a null offset. At step 908, between time $t_3$ and time $t_4$, the first main-controller 706a loads OTP repair data from the first partition 602 of the OTP memory 502 based on the OTP bus address 814 and de-asserts (e.g., logic level low) a first status signal 806.

At step 910, after loading the OTP repair data from the first partition 602 of OTP memory 502, by the first main-controller 706a at time $t_4$, the first status signal 806 is asserted (e.g., logic level high).

In response, at step 912 and at time $t_5$, OTP sequencer circuit 710 asserts (e.g., logic level high) a second grant signal 808 for the second main-controller 706b and de-asserts (e.g., logic level high) the first grant signal 804 for the first main-controller 706a. Further, repair controller 708 instructs the second main-controller 706b to load OTP repair data. However, during this sequence, the offset logic and selection circuit 704 adds an offset to the main-controller bus address 812 to generate the OTP bus address 814 from which the OTP repair data begins loading (i.e., second partition 602). The OTP bus address 814, thus, points to the second partition 602 in the OTP memory 502.

At step 914, between time $t_6$ and time $t_7$, the second main-controller 706b fetches OTP repair data from the second partition 602 of the OTP memory 502 based on the OTP bus address 814 and de-asserts (e.g., logic level low) a second status signal 810.

At step 916, after completion of the loading of the OTP repair data from the second partition 602 of OTP memory 502, by the second main-controller 706b at time $t_8$, the second status signal 810 is asserted (e.g., logic level high). At step 918, OTP sequencer circuit 710 de-asserts (e.g., logic level high) the second grant signal 808 for the second main-controller 706b.

Figure 10:
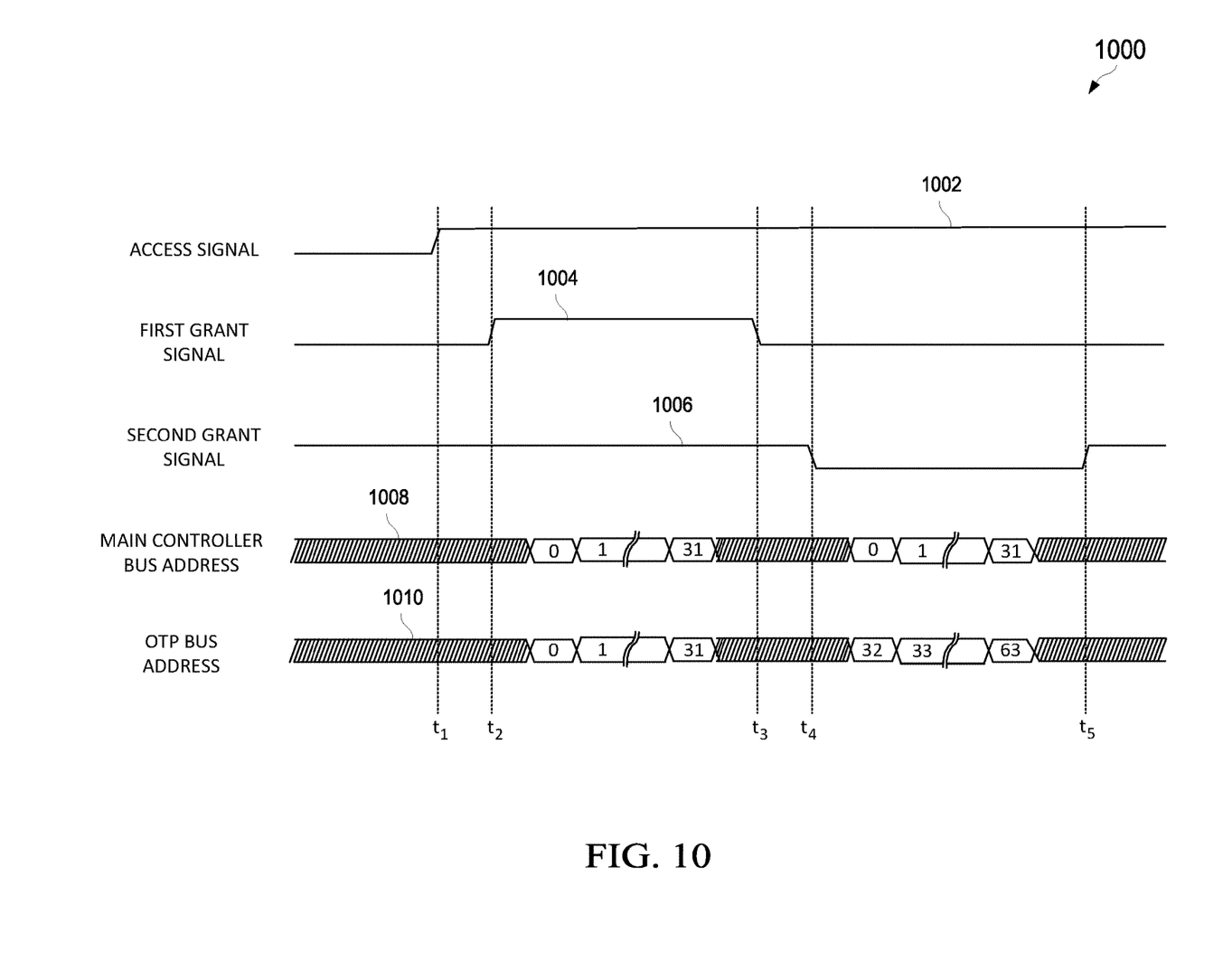
FIGS. 10 and 11, respectively, are an embodiment timing diagram and a corresponding method where the system in FIG. 7 is operating in test mode.
Figure 11:
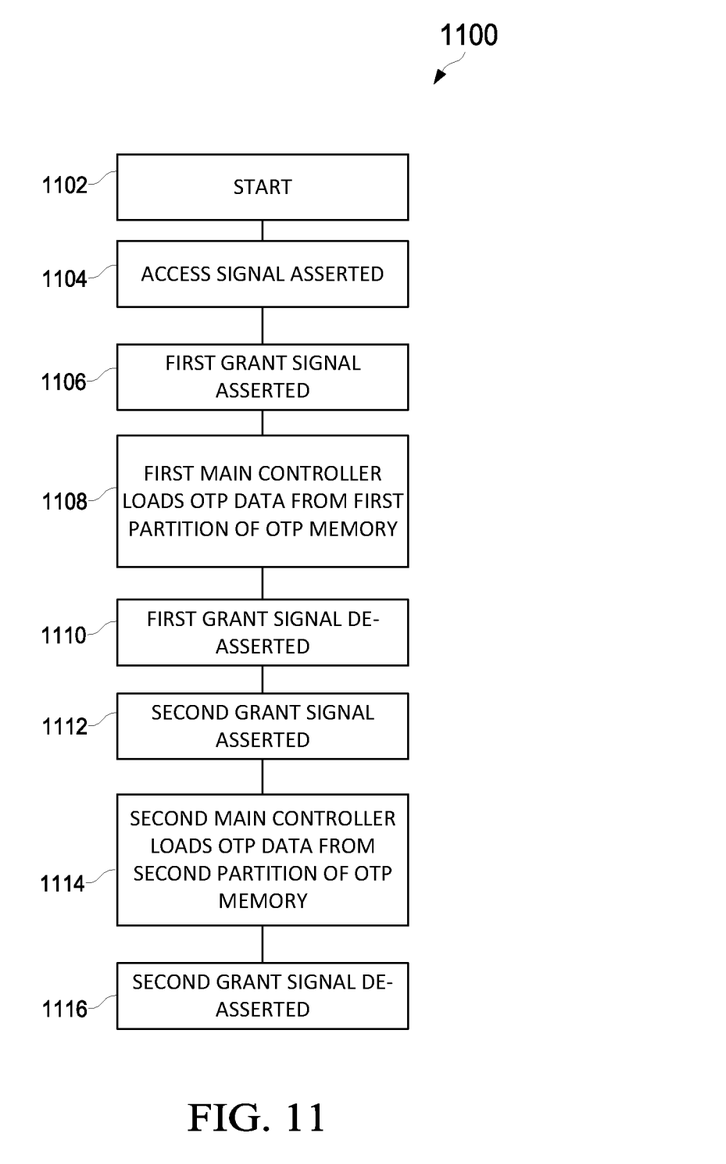

FIGS. 10 and 11, respectively, illustrate an embodiment timing diagram 1000 and a corresponding method 1100 where the system 700 operates in test mode. The method starts at step 1102, before time $t_1$, the access signal 1002 is de-asserted (e.g., logic level low). As the access signal 1002 is de-asserted, the hardware accelerator 100 is not yet in test mode. At step 1104, at time $t_1$, the access signal 1002 is asserted (e.g., logic level high), and hardware accelerator 100 enters test mode.

At step 1106, at time $t_2$, TCR 716 asserts (e.g., logic level high) a first grant signal 1004 for the first main-controller 706a, which instructs the first main-controller 706a to load OTP repair data. As the associated partition 602 for the first main-controller 706a begins at address 'o', the main-controller bus address 812 is identical to the OTP bus address 814, with a null offset. At step 1108, between time $t_2$ and time $t_3$, the first main-controller 706a loads OTP repair data from the first partition 602 of the OTP memory 502 based on the OTP bus address 814.

At step 1110, after loading the OTP repair data from the first partition 602 of OTP memory 502, by the first main-controller 706a at time $t_3$, TCR 716 de-asserts (e.g., logic level low) the first grant signal 1004. In embodiments, the timing is pre-determined as there is typically no feedback during test mode, and manufacturing tests—the test pattern times are fixed and generally independent from a feedback signal.

At step 1112, at time $t_4$, TCR 716 asserts (e.g., logic level high) a second grant signal 1006 for the second main-controller 706b, instructs the second main-controller 706b to load OTP repair data. However, during this sequence, the offset logic and selection circuit 704 adds an offset to the main-controller bus address 812 to generate the OTP bus address 814 from which the OTP repair data begins loading (i.e., second partition 602). The OTP bus address 814, thus, points to the second partition 602 in the OTP memory 502.

At step 1114, between time $t_4$ and time $t_5$, the second main-controller 706b fetches OTP repair data from the second partition 602 of the OTP memory 502 based on the OTP bus address 814.

At step 1116, after completion of the loading of the OTP repair data from the second partition 602 of OTP memory 502, by the second main-controller 706b at time $t_5$, the second grant signal is de-asserted (e.g., logic level low).

It is noted that all steps outlined in the flow charts of methods 900 and 1100 are not necessarily required and can be optional. Further, changes to the arrangement of the steps, removal of one or more steps and path connections, and addition of steps and path connections are similarly contemplated.

A first aspect relates to a system for testing and repairing of local memory in a hardware accelerator. The system includes a one-time programmable (OTP) memory, an OTP sequencer circuit, a first main-controller, a second main-controller, and an offset addition and selection logic circuit. The OTP memory is configured to sequentially store first repair data in a first partition and second repair data in a second partition for, respectively, a first subset of the local memory and a second subset of the local memory. The OTP sequencer circuit is configured to assert a first grant signal. The first main-controller is coupled to the OTP sequencer circuit and the first subset of the local memory. The first main-controller configured to first load the first repair data for the first subset of the local memory from the first partition, and communicate a first status signal to the OTP sequencer circuit after completion of the first loading indicating a completion of the first loading. The OTP sequencer circuit is further configured to de-assert the first grant signal in response to the OTP sequencer circuit receiving the first status signal and assert a second grant signal in response to the de-asserting of the first grant signal. The offset addition and selection logic circuit is configured to add an offset to an address used by a second main-controller to access the second partition. The second main-controller configured to second load the second repair data for the second subset of the local memory associated with the second main-controller from the second partition using the address to access the second partition, and communicate a second status signal to the OTP sequencer circuit after completion of the second loading indicating a completion of the second loading. The OTP sequencer circuit is further configured to de-assert the second grant signal in response to the OTP sequencer circuit receiving the second status signal.

In a first implementation form of the system according to the first aspect as such, the OTP sequencer circuit is configured to generate the first grant signal in response to the OTP sequencer circuit receiving a functional mode reset signal.

In a second implementation form of the system according to the first aspect as such or any preceding implementation form of the first aspect, the system further includes a first repair controller coupled to the first main-controller and the OTP sequencer circuit. The OTP sequencer circuit is configured to instruct the first main-controller to load the first repair data by the first repair controller in response to receiving the first grant signal.

In a third implementation form of the system according to the first aspect as such or any preceding implementation form of the first aspect, the system further includes a second repair controller coupled to the second main-controller and the OTP sequencer circuit. The OTP sequencer circuit is configured to instruct the second main-controller to load the second repair data by the second repair controller in response to receiving the second grant signal.

In a fourth implementation form of the system according to the first aspect as such or any preceding implementation form of the first aspect, the hardware accelerator includes a Graphics Processing Unit (GPU), a Field Programmable Gate Array (FPGA), an Application-Specific Integrated Circuit (ASIC), or a combination thereof.

In a fifth implementation form of the system according to the first aspect as such or any preceding implementation form of the first aspect, the hardware accelerator is used for artificial intelligence or machine learning.

In a sixth implementation form of the system according to the first aspect as such or any preceding implementation form of the first aspect, the second repair data is sequentially stored after the first repair data in the OTP memory such that the offset added to the address points to a memory space immediately after the first repair data.

A second aspect relates to a method for testing and repairing of local memory in a hardware accelerator from a one-time programmable memory (OTP). The method includes asserting, by a one-time programmable (OTP) sequencer circuit, a first grant signal; a first loading, by a first main-controller, of a first repair data for a first sub-set of the local memory associated with the first main-controller from a first partition of the OTP memory; communicating, by the first main-controller, a first status signal to the OTP sequencer circuit after completion of the first loading indicating a completion of the first loading; de-asserting, by the OTP sequencer circuit, the first grant signal in response to the OTP sequencer circuit receiving the first status signal; asserting, by the OTP sequencer circuit, a second grant signal in response to the de-asserting of the first grant signal; adding, by an offset addition and selection logic circuit, an offset to an address used by a second main-controller to access a second partition of the OTP memory comprising a second repair data, wherein the first repair data and the second repair data are sequentially loaded in the OTP memory; a second loading, by the second main-controller, of the second repair data for a second sub-set of the local memory associated with the second main-controller from the second partition of the OTP memory using the address to access the second partition; communicating, by the second main-controller, a second status signal to the OTP sequencer circuit after completion of the second loading indicating a completion of the second loading; and de-asserting, by the OTP sequencer circuit, the second grant signal in response to the OTP sequencer circuit receiving the second status signal.

In a first implementation form of the method according to the second aspect as such, the first grant signal is generated in response to the OTP sequencer circuit receiving a functional mode reset signal.

In a second implementation form of the method according to the second aspect as such or any preceding implementation form of the second aspect, the method further includes instructing the first main-controller to load the first repair data by a first repair controller in response to receiving the first grant signal. The first repair controller is coupled to the first main-controller and the OTP sequencer circuit.

In a third implementation form of the method according to the second aspect as such or any preceding implementation form of the second aspect, the method further includes instructing the second main-controller to load the second repair data by a second repair controller in response to receiving the second grant signal. The second repair controller is coupled to the second main-controller and the OTP sequencer circuit.

In a fourth implementation form of the method according to the second aspect as such or any preceding implementation form of the second aspect, the hardware accelerator includes a Graphics Processing Unit (GPU), a Field Programmable Gate Array (FPGA), an Application-Specific Integrated Circuit (ASIC), or a combination thereof.

In a fifth implementation form of the method according to the second aspect as such or any preceding implementation form of the second aspect, the hardware accelerator is used for artificial intelligence or machine learning.

In a sixth implementation form of the method according to the second aspect as such or any preceding implementation form of the second aspect, the method further includes storing the second repair data sequentially after the first repair data in the OTP memory such that the offset added to the address points to a memory space immediately after the first repair data.

A third aspect relates to a system for testing and repairing of local memory in a hardware accelerator. The system includes a one-time programmable (OTP) memory, a test control register (TCR), a first main-controller, a second main-controller, and an offset addition and selection logic circuit. The OTP memory is configured to sequentially store first repair data in a first partition and second repair data in a second partition for, respectively, a first subset of the local memory and a second subset of the local memory. The TCR is configured to assert a first grant signal. The first main-controller is coupled to the first subset of the local memory, the first main-controller configured to first load the first repair data for the first subset of the local memory from the first partition in response to the first grant signal being asserted. The offset addition and selection logic circuit coupled to the TCR and the first main-controller. The offset addition and selection logic circuit configured to add an offset to an address used by a second main-controller to access the second partition. The TCR is further configured to de-assert the first grant signal and assert a second grant signal in response to the de-asserting of the first grant signal. The second main-controller configured to second load the second repair data for the second subset of the local memory associated with the second main-controller from the second partition using the address to access the second partition in response to the second grant signal being asserted, wherein the TCR is further configured to de-assert the second grant signal.

In a first implementation form of the system according to the third aspect as such, the TCR is further configured to assert an access signal to operate the hardware accelerator in test mode.

In a second implementation form of the system according to the third aspect as such or any preceding implementation form of the third aspect, the hardware accelerator includes a Graphics Processing Unit (GPU), a Field Programmable Gate Array (FPGA), an Application-Specific Integrated Circuit (ASIC), or a combination thereof.

In a third implementation form of the system according to the third aspect as such or any preceding implementation form of the third aspect, the hardware accelerator is used for artificial intelligence or machine learning.

In a fourth implementation form of the system according to the third aspect as such or any preceding implementation form of the third aspect, the second repair data is sequentially stored after the first repair data in the OTP memory such that the offset added to the address points to a memory space immediately after the first repair data.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A system for testing and repairing local memory in a hardware accelerator, the system comprising:
   a one-time programmable (OTP) memory configured to sequentially store first repair data in a first partition and second repair data in a second partition for, respectively, a first subset of the local memory and a second subset of the local memory;
   an OTP sequencer circuit configured to assert a first grant signal;
   a first main-controller coupled to the OTP sequencer circuit and the first subset of the local memory, the first main-controller configured to:
      first load the first repair data for the first subset of the local memory from the first partition, and
      communicate a first status signal to the OTP sequencer circuit after completion of the first loading indicating a completion of the first loading, wherein the OTP sequencer circuit is further configured to de-assert the first grant signal in response to the OTP sequencer circuit receiving the first status signal and assert a second grant signal in response to the de-asserting of the first grant signal;
   an offset addition and selection logic circuit configured to add an offset to an address used by a second main-controller to access the second partition; and
   the second main-controller configured to:
      second load the second repair data for the second subset of the local memory associated with the second main-controller from the second partition using the address to access the second partition, and
      communicate a second status signal to the OTP sequencer circuit after completion of the second loading indicating a completion of the second loading, wherein the OTP sequencer circuit is further configured to de-assert the second grant signal in response to the OTP sequencer circuit receiving the second status signal.

2. The system of claim 1, wherein the OTP sequencer circuit is configured to generate the first grant signal in response to the OTP sequencer circuit receiving a functional mode reset signal.

3. The system of claim 1, further comprising a first repair controller coupled to the first main-controller and the OTP sequencer circuit, wherein the OTP sequencer circuit is configured to instruct the first main-controller to load the first repair data by the first repair controller in response to receiving the first grant signal.

4. The system of claim 1, further comprising a second repair controller coupled to the second main-controller and the OTP sequencer circuit, wherein the OTP sequencer circuit is configured to instruct the second main-controller to load the second repair data by the second repair controller in response to receiving the second grant signal.

5. The system of claim 1, wherein the hardware accelerator comprises a Graphics Processing Unit (GPU), a Field Programmable Gate Array (FPGA), an Application-Specific Integrated Circuit (ASIC), or a combination thereof.

6. The system of claim 1, wherein the hardware accelerator is used for artificial intelligence or machine learning.

7. The system of claim 1, wherein the second repair data is sequentially stored after the first repair data in the OTP memory such that the offset added to the address points to a memory space immediately after the first repair data.

8. A method for testing and repairing local memory in a hardware accelerator from a one-time programmable memory (OTP), the method comprising:
   asserting, by an OTP sequencer circuit, a first grant signal;
   a first loading, by a first main-controller, of a first repair data for a first sub-set of the local memory associated with the first main-controller from a first partition of the OTP memory;
   communicating, by the first main-controller, a first status signal to the OTP sequencer circuit after completion of the first loading indicating a completion of the first loading;
   de-asserting, by the OTP sequencer circuit, the first grant signal in response to the OTP sequencer circuit receiving the first status signal;
   asserting, by the OTP sequencer circuit, a second grant signal in response to the de-asserting of the first grant signal;
   adding, by an offset addition and selection logic circuit, an offset to an address used by a second main-controller to access a second partition of the OTP memory comprising a second repair data, wherein the first repair data and the second repair data are sequentially loaded in the OTP memory;
   a second loading, by the second main-controller, of the second repair data for a second sub-set of the local memory associated with the second main-controller from the second partition of the OTP memory using the address to access the second partition;
   communicating, by the second main-controller, a second status signal to the OTP sequencer circuit after completion of the second loading indicating a completion of the second loading; and
   de-asserting, by the OTP sequencer circuit, the second grant signal in response to the OTP sequencer circuit receiving the second status signal.

9. The method of claim 8, wherein the first grant signal is generated in response to the OTP sequencer circuit receiving a functional mode reset signal.

10. The method of claim 8, further comprising instructing the first main-controller to load the first repair data by a first repair controller in response to receiving the first grant signal, wherein the first repair controller is coupled to the first main-controller and the OTP sequencer circuit.

11. The method of claim 8, further comprising instructing the second main-controller to load the second repair data by a second repair controller in response to receiving the second grant signal, wherein the second repair controller is coupled to the second main-controller and the OTP sequencer circuit.

12. The method of claim 8, wherein the hardware accelerator comprises a Graphics Processing Unit (GPU), a Field Programmable Gate Array (FPGA), an Application-Specific Integrated Circuit (ASIC), or a combination thereof.

13. The method of claim 8, wherein the hardware accelerator is used for artificial intelligence or machine learning.

14. The method of claim 8, further comprising storing the second repair data sequentially after the first repair data in the OTP memory such that the offset added to the address points to a memory space immediately after the first repair data.

15. A system for testing and repairing local memory in a hardware accelerator, the system comprising:
- a one-time programmable (OTP) memory configured to sequentially store first repair data in a first partition and second repair data in a second partition for, respectively, a first subset of the local memory and a second subset of the local memory;
- a test control register (TCR) configured to assert a first grant signal;
- a first main-controller coupled to the first subset of the local memory, the first main-controller configured to first load the first repair data for the first subset of the local memory from the first partition in response to the first grant signal being asserted;
- an offset addition and selection logic circuit coupled to the TCR and the first main-controller, the offset addition and selection logic circuit configured to add an offset to an address used by a second main-controller to access the second partition, wherein the TCR is further configured to de-assert the first grant signal and assert a second grant signal in response to the de-asserting of the first grant signal; and
- the second main-controller configured to second load the second repair data for the second subset of the local memory associated with the second main-controller from the second partition using the address to access the second partition in response to the second grant signal being asserted, wherein the TCR is further configured to de-assert the second grant signal.

16. The system of claim 15, wherein the TCR is further configured to assert an access signal to operate the hardware accelerator in test mode.

17. The system of claim 15, wherein the hardware accelerator comprises a Graphics Processing Unit (GPU), a Field Programmable Gate Array (FPGA), an Application-Specific Integrated Circuit (ASIC), or a combination thereof.

18. The system of claim 15, wherein the hardware accelerator is used for artificial intelligence or machine learning.

19. The system of claim 15, wherein the second repair data is sequentially stored after the first repair data in the OTP memory such that the offset added to the address points to a memory space immediately after the first repair data.

20. The system of claim 15, further comprising a test access point (TAP) couplable to the TCR, the TAP configured to control operations of the TCR during a test mode operation of the hardware accelerator.

* * * * *